(12) United States Patent
Albagli et al.

(10) Patent No.: US 7,495,228 B1
(45) Date of Patent: Feb. 24, 2009

(54) DUAL FUNCTION DETECTOR DEVICE

(75) Inventors: Douglas Albagli, Clifton Park, NY (US); Aaron Judy Couture, Schenectady, NY (US); William Andrew Hennessy, Schenectady, NY (US); Kenneth Scott Kump, Waukesha, WI (US); Feng Gao, Naperville, IL (US); James Zhengshe Liu, Glenview, IL (US)

(73) Assignee: General Electric Company, Nishayuna, NY (US)

( * ) Notice: Subject to any disclaimer, the term of this patent is extended or adjusted under 35 U.S.C. 154(b) by 0 days.

(21) Appl. No.: 11/971,533

(22) Filed: Mar. 31, 2008

(51) Int. Cl.
*H01L 27/146* (2006.01)
(52) U.S. Cl. .................................. 250/370.09
(58) Field of Classification Search .................................
250/370.01–370.15
See application file for complete search history.

(56) References Cited

U.S. PATENT DOCUMENTS

| | | | |
|---|---|---|---|
| 6,759,641 B1 | 7/2004 | Loose | 250/208.1 |
| 2005/0121616 A1 | 6/2005 | Petrick | 250/370.09 |

*Primary Examiner*—David P Porta
*Assistant Examiner*—Kiho Kim
(74) *Attorney, Agent, or Firm*—Jason K. Klindtworth

(57) ABSTRACT

A dual function detector device operates in either a normal operating mode or in an EMI correction mode to suppress effects of EMI within the detector. The detector device may be a flat panel x-ray detectors used in x-ray imaging systems. The device has a pixel architecture and panel read-out technique that enables real-time, high spatial frequency measurement of noise induced by electromagnetic radiation on a digital x-ray detector. The measurement can be used to calibrate the detector in real-time to attain artifact-free imaging in all environments, including those that contain temporally and spatially changing electromagnetic fields.

20 Claims, 10 Drawing Sheets

DUAL FUNCTION DETECTOR DEVICE

BACKGROUND

The invention relates generally to x-ray imaging systems. More particularly, the present invention relates to improved x-ray detectors and methods of operating the same.

In the field of diagnostic or medical imaging, flat panel digital x-ray detectors are routinely used. Flat panel digital x-ray detectors generally provide higher image quality and improved processing time, image storage and image transfer over previously known x-ray film techniques. However, the digital x-ray detectors available today have high sensitivity and make the detector susceptible to electromagnetic interferences (EMI), and EMI is even more likely in portable detector systems. Unlike traditional table or wall stand x-ray systems that operate in designated x-ray rooms, portable units work almost everywhere in the hospital. It has also been found that some hospital equipment and systems interfere with the detector and generate artifacts in the x-ray image.

Flat panel x-ray detectors are now used routinely for medical imaging. In the typical configuration, the detectors can be sensitive to electromagnetic radiation produced in the local environment. Examples of equipment that may produce electromagnetic radiation include CRT monitors, catheter navigation systems, and surgical ablation devices. Temporally and spatially changing electromagnetic fields can induce phantom signals in the x-ray detector. These image artifacts can degrade the overall image quality of x-ray imaging system. Although shielding can be used to attenuate the amplitude of the electromagnetic radiation, this shielding will also attenuate the x-ray radiation and degrade the overall image quality of the x-ray imaging system. The proposed invention will reduce the sensitivity to electromagnetic radiation without reducing the x-ray sensitivity.

BRIEF DESCRIPTION

In accordance with a first aspect of the present invention, a detector device is provided and includes: at least one pixel having an photodetector portion and a non-photodetector portion; a first line for operably coupling to each of the portions of the pixel; a second line arranged to separate a middle of the at least one pixel, wherein the second line is not operably coupled to the at least one pixel; and wherein the first line is selectively enabled to selectively activate the photodetector portion.

In accordance with a first aspect of the present invention, an x-ray detector device is provided and includes: a plurality of pixels including a photodiode portion and a FET portion for receiving x-ray signals; at least one scan line coupled to at least a first portion of the pixels for selectively activating at least a first portion of the pixels; and, at least one data line for conducting charge indicative of the x-ray signals.

In accordance with a third aspect of the present invention, a method for operating an x-ray detector is provided and includes: simultaneously acquiring image and electromagnetic inference (EMI) correction data during an acquisition; and operating the detector in either a normal operating mode or in an EMI correction mode.

DRAWINGS

These and other features, aspects, and advantages of the present invention will become better understood when the following detailed description is read with reference to the accompanying drawings in which like characters represent like parts throughout the drawings, wherein:

FIG. 1, a perspective and block diagrammatic view of an x-ray imaging system utilizing a detector array or a flat-panel x-ray detector in accordance with an embodiment of the invention.

Figure 4:
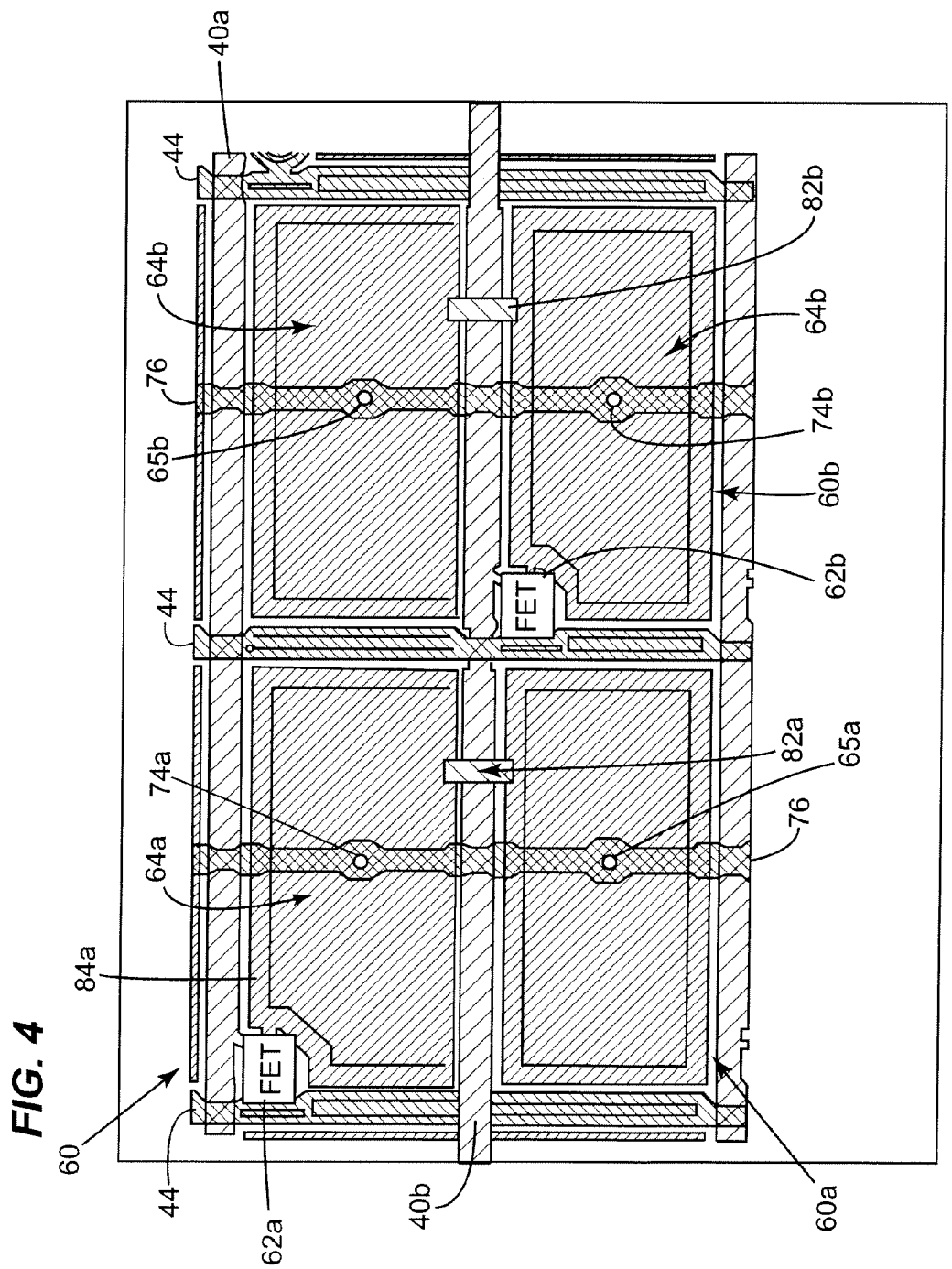
FIG. 4 is plan view of a portion of the flat panel detector shown in accordance with an embodiment of the invention.
Figure 5:
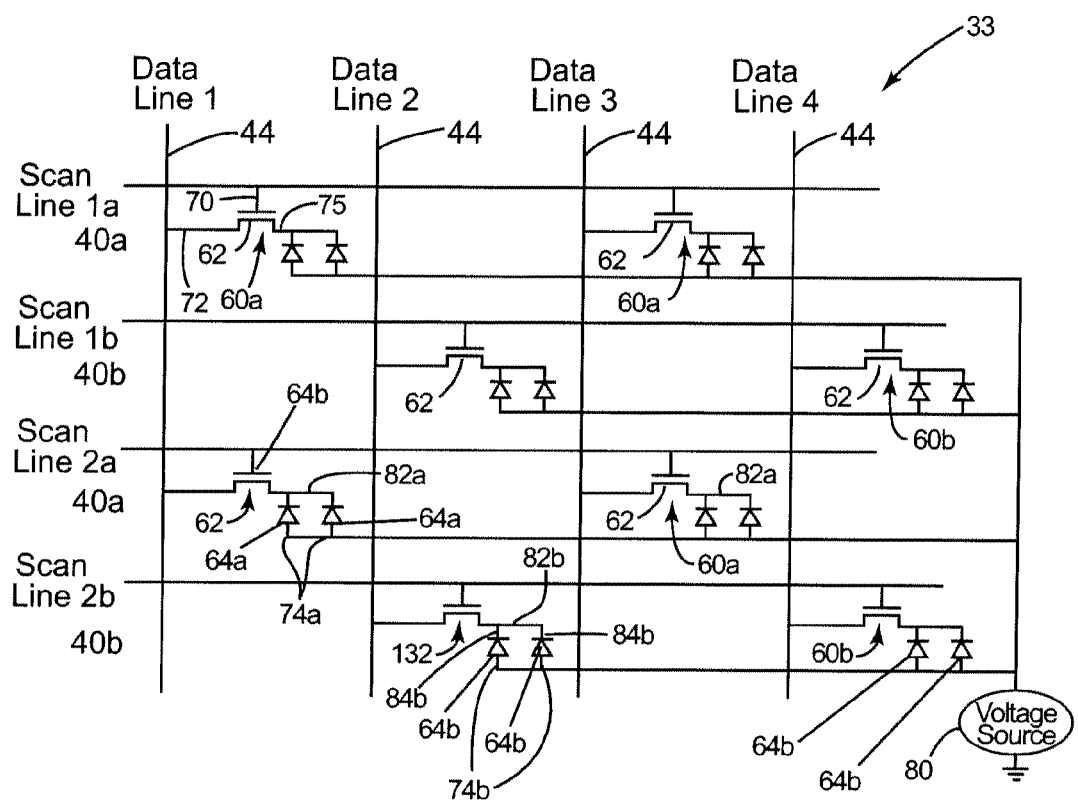

FIG. 5, a schematic and block diagrammatic view of an x-ray detector panel, formed of the pixel architecture shown in FIG. 4

Figure 6:
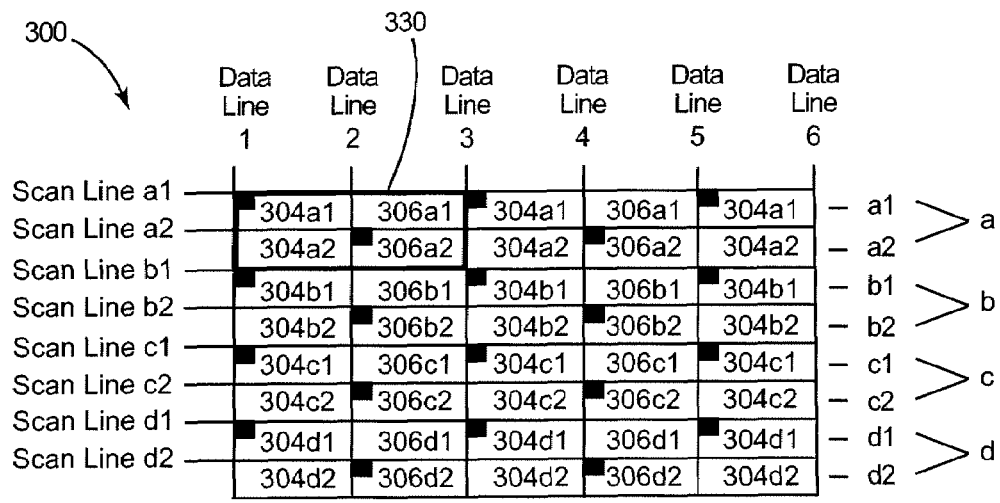

FIG. 6 is a schematic of a pixel architecture of a portion of a detector illustrating a double scan line configuration in accordance with an embodiment of the invention.

Figure 7:
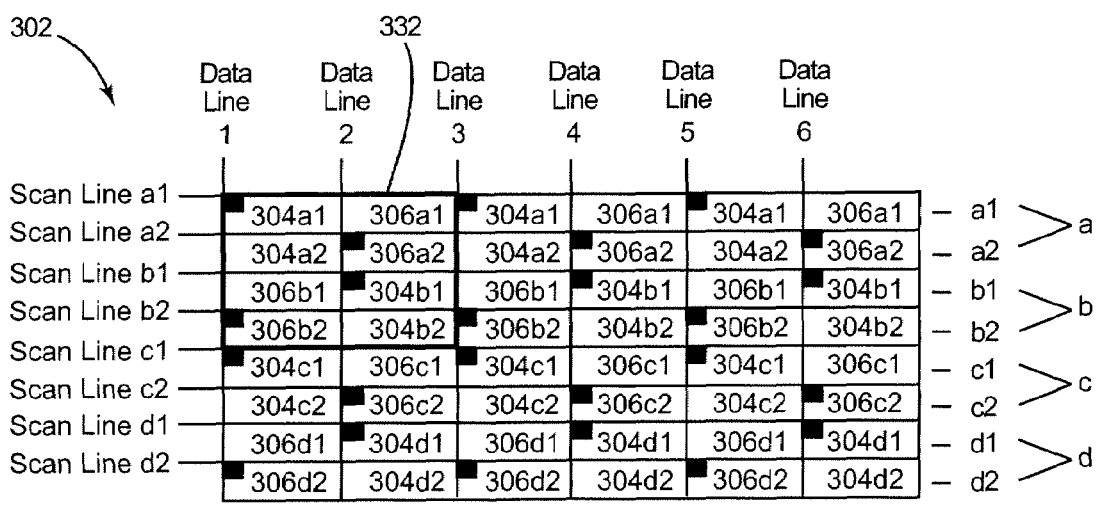

FIG. 7 is a schematic of a binned pixel architecture of a portion of a detector illustrating a double scan line configuration in accordance with an embodiment of the invention.

Figure 8:
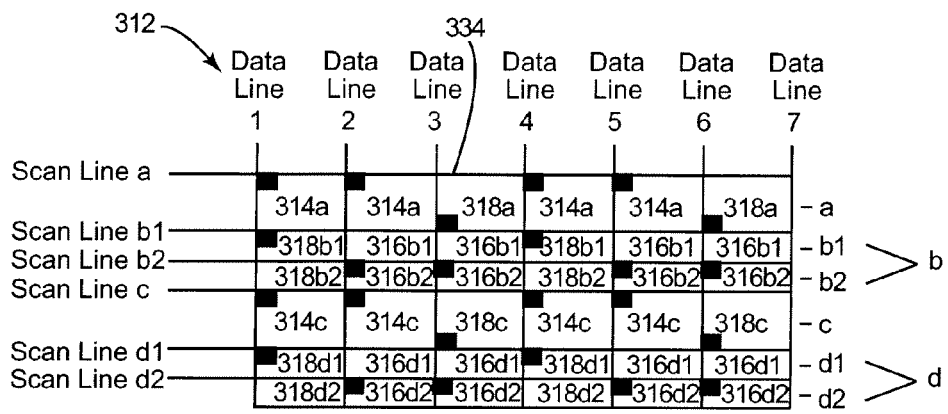

FIG. 8 is a schematic of a binned pixel architecture of a portion of a detector with a 2×3 pixel unit cell illustrating an additional scan line added after every second row of pixels in accordance with an embodiment of the invention.

Figure 9:
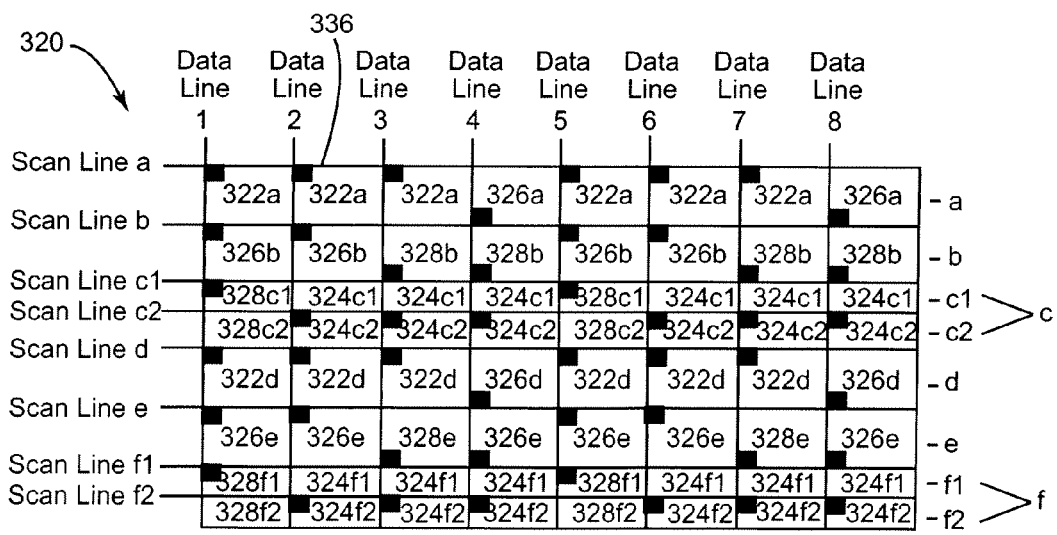

FIG. 9 is a schematic of a binned pixel architecture of a portion of a detector with a 3×4 pixel unit cell illustrating an additional scan line added after every second row of pixels in accordance with an embodiment of the invention.

Figure 10:
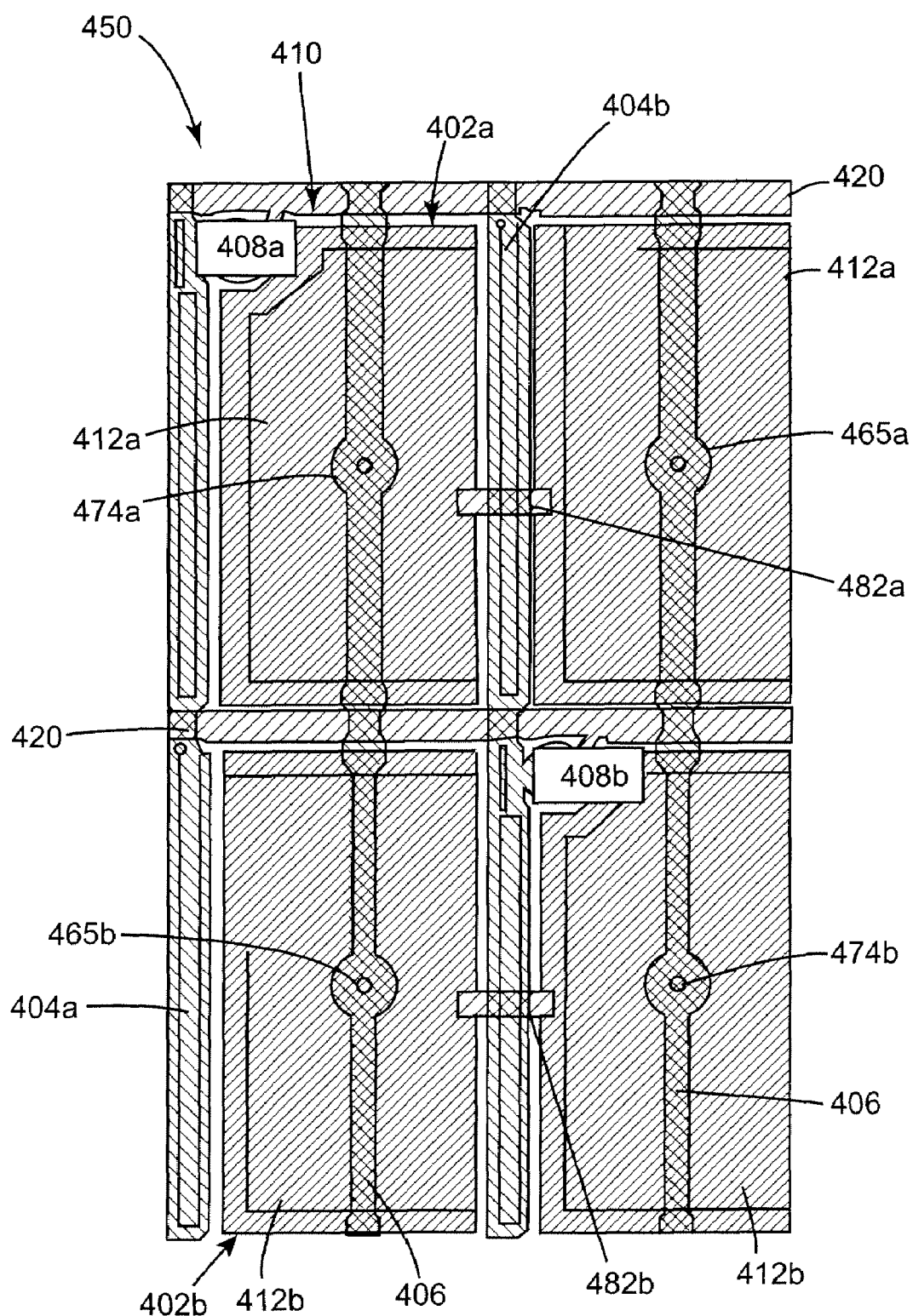

FIG. 10 is plan view of a portion of a flat panel detector having dual data lines shown in accordance with an embodiment of the invention.

Figure 11:
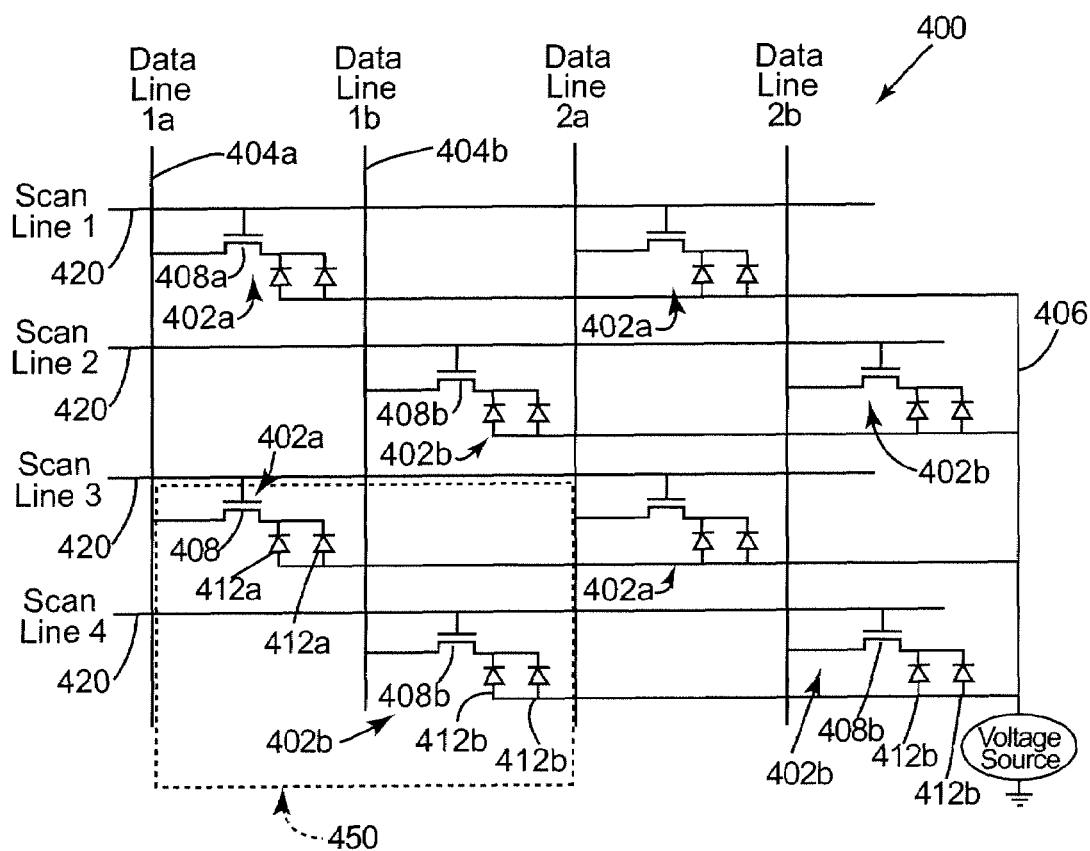

FIG. 11 is a block diagram and schematic of a pixel architecture in a detector device having two data lines associated with each column of pixels in accordance with an embodiment of the invention.

Figure 12:
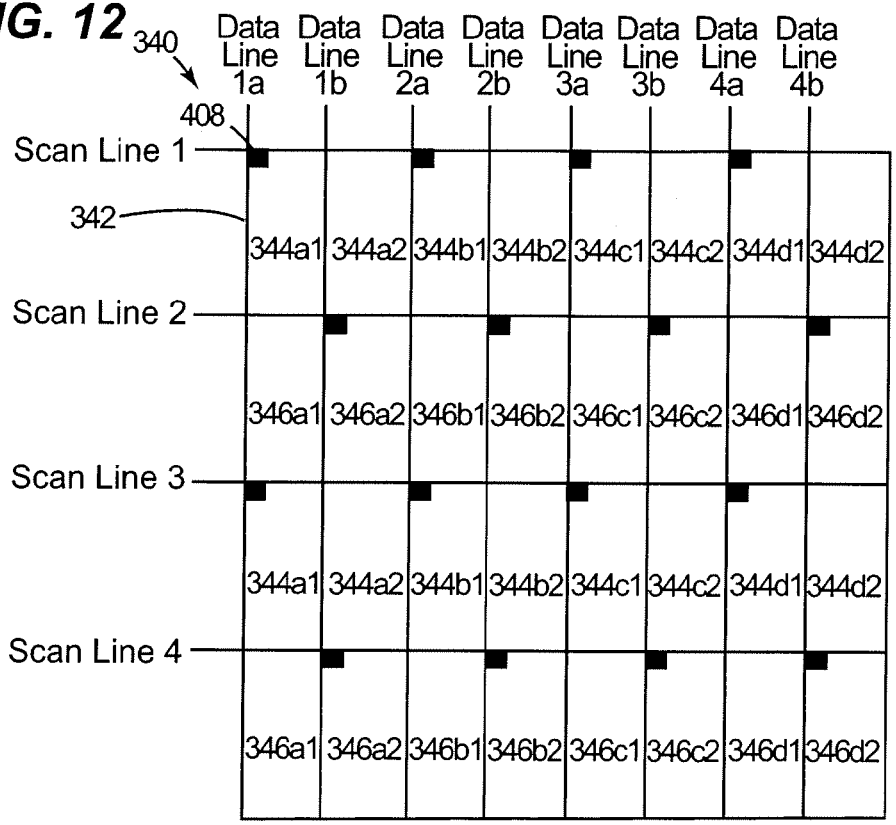

FIG. 12 is a schematic of a pixel architecture of a portion of a detector with a 1×2 pixel unit cell illustrating a double data line configuration associated with every column of pixels in accordance with an embodiment of the invention.

Figure 13:
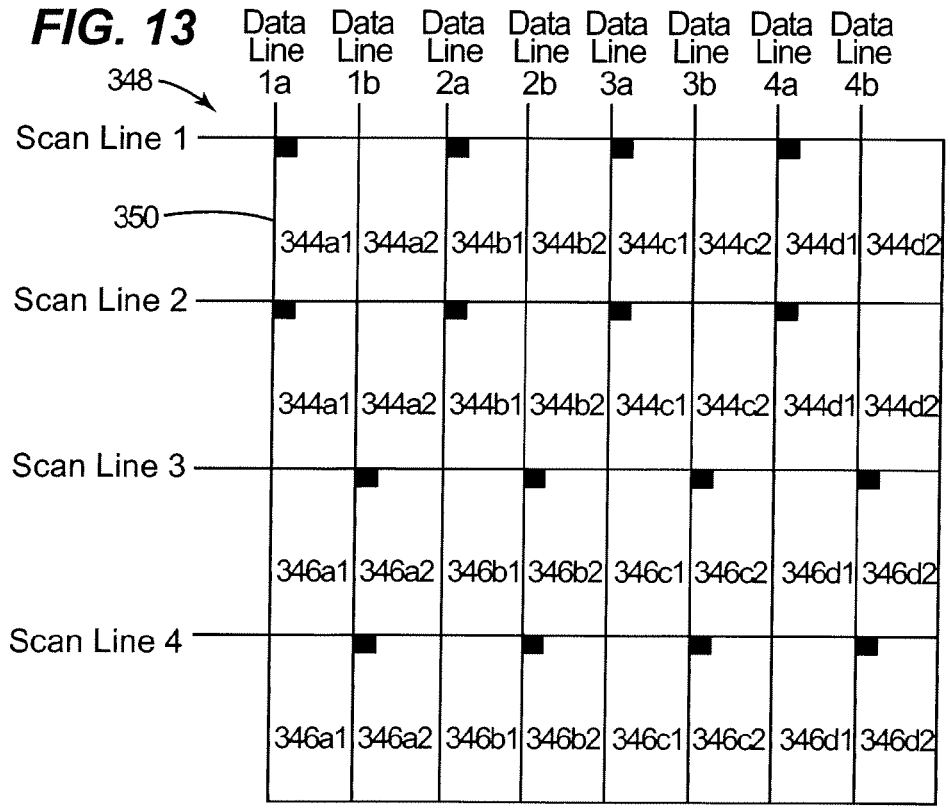

FIG. 13 is a schematic of a binned pixel architecture of a portion of a detector with a 1×4 pixel unit cell illustrating a double data line configuration associated with every column of pixels in accordance with an embodiment of the invention.

DETAILED DESCRIPTION

The invention relates to a pixel architecture and panel read-out technique that enables real-time, high spatial frequency measurement of noise induced by electromagnetic radiation on a digital x-ray detector of the type used in x-ray imaging systems.

The effects of the electromagnetic radiation on digital x-ray detectors, i.e. electromagnetic interference (EMI) are a function of time, space, (i.e. the x-y coordinate on the flat panel), and detector design. Low level electrical parameters associated with characteristics including, but not limited to resistance, capacitance, bandwidth, geometric size and shape associated with the pixel architecture cause coupling of the electromagnetic field to the digital detector.

In an embodiment of the invention, a duplicate device structure for collection of both EMI correction data and image data is used, wherein the device structure includes not only pixels, but also the lines used to address and read-out selected pixels including data lines, scan lines, a common electrode to associated read-out electronics, such as an application-specific integrated circuit (ASIC) in electrical signal communication with each data line, wherein the ASIC is used to read-out the charge and convert it to a digital signal. The measurements obtained using the invention may be used to calibrate the detector in real-time to attain artifact-free imaging in all environments, including those that contain temporally and spatially changing electromagnetic fields.

In the following figures, the same reference numerals will be used to refer to the same components. While the invention is described with respect to x-ray detectors, corresponding x-ray systems, and methods for operating each, the present invention is capable of being adapted for various purposes and is not limited to the following applications: computed tomography (CT) systems, radiotherapy or radiographic systems, x-ray imaging systems, and other applications known in the art. The present invention may be applied to radiographic detectors, cardiographic detectors, or other detectors known in the art.

In the following description, various operating parameters and components are described for one constructed embodiment. These specific parameters and components are included as examples and are not meant to be limiting.

Figure 1:
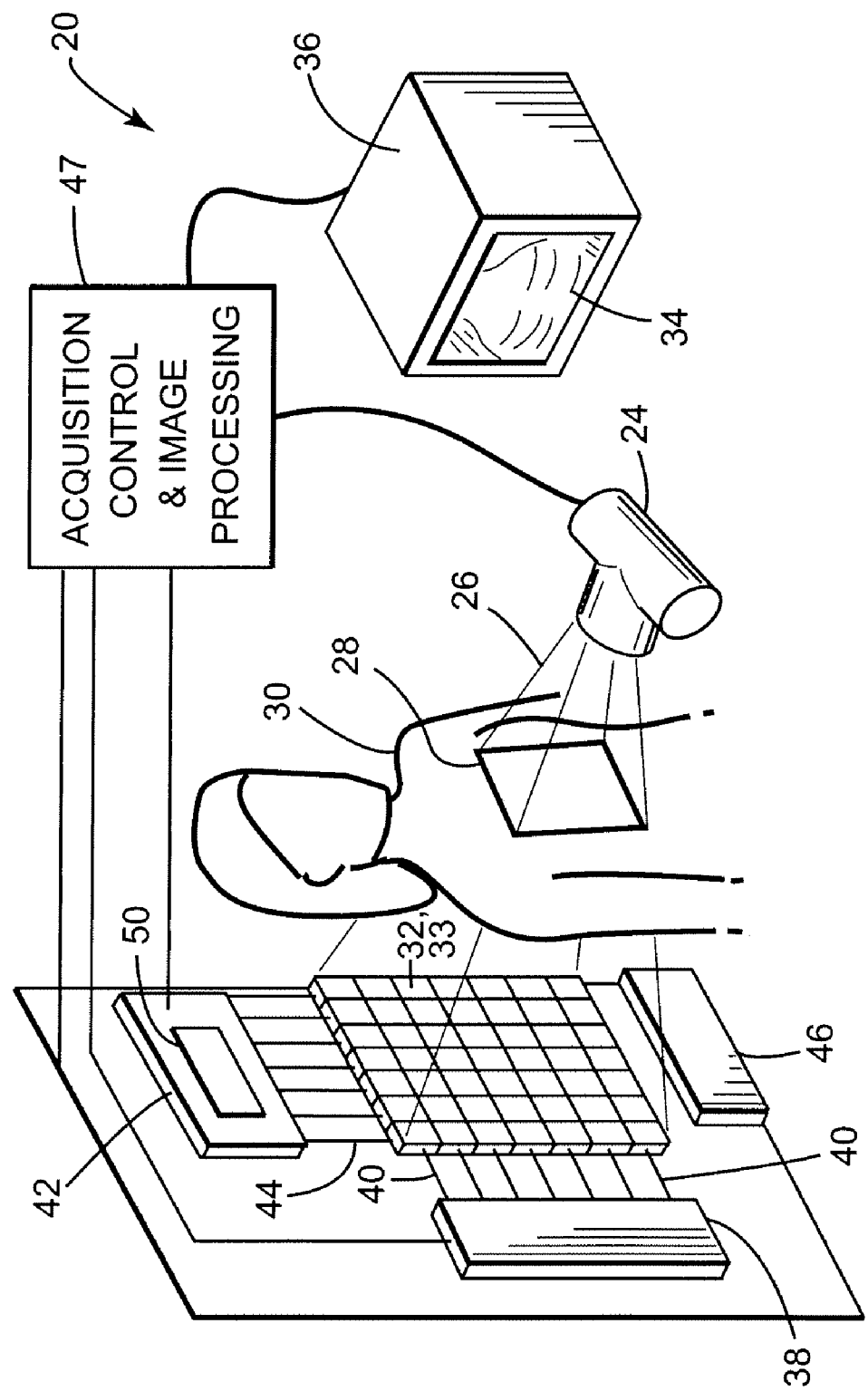

Referring now to FIG. 1, a perspective and block diagrammatic view of an x-ray imaging system 20 utilizing a detector array or a flat-panel x-ray detector 32 in accordance with an embodiment of the present invention is shown. The system 20 includes an x-ray source 24 that generates an x-ray beam 26, which is directed to pass through a region-of-interest 28 of a patient 30. The beam 26 is attenuated by an internal structure of the patient 30 and is received by the detector 32. The system 20 may operate in two modes including a normal operating mode that does not suppress EMI and an EMI suppression mode that simultaneously reads the panel detector 32 at a slower speed than normal operation and also corrects for EMI occurring by obtaining EMI offset data within the detector 32. Thus, the system 20 provides a dual function x-ray detector capable of operating in a normal operation mode or in an EMI correction mode in accordance with multiple embodiments of the invention.

A method of using the detector 32 to eliminate EMI is disclosed with reference to FIGS. 6-9, and 10-13 in accordance with several embodiments of the invention.

In an embodiment of the invention, image data and EMI correction data are simultaneously collected in contrast to existing methods, as discussed herein, that do not collect correction data simultaneously, but rather at an earlier or later time than the image data is collected. In an embodiment of the invention, EMI correction data is acquired at a high spatial frequency, that may be less than 2 cm such as, but not limited to 100 um across the entire active area of the flat panel detector 32.

The EMI offset correction enables the x-ray detector to operate in a plurality of modes, wherein one mode includes EMI correction that operates to suppress EMI from the detector and another mode does not include EMI correction.

A typical flat panel x-ray detector includes an array of 2D photosensitive diodes and switching transistors (FETs) arranged in rows and columns. A portion of the flat panel detector 32 depicted in FIG. 1 is shown in FIG. 3; the detector 32 is made from a plurality of pixels as shown in more detail in FIG. 2. Scan lines are provided to control the switching of the transistors, and data lines are provided to conduct the signal from the array to the readout electronics. Typically, the data lines all have FETs connected on every row of the array. When a scan line is energized and switches on a row of FETs, the x-ray signal is simultaneously read out in parallel to data conversion electronics. Data from an entire image is read out by sequentially reading out all the rows of the detector.

Generally, as is well-known and will only be described briefly herein, a digital x-ray detector commonly has an array of pixels composed of field effect transistors (FETs) 146 that perform as switches and photodiodes 148, to detect light in a known manner. The FETs 146 and the photodiodes 148 are constructed of, for example, amorphous silicon, over which cesium iodide (CsI) or other known materials is deposited. The CsI absorbs x-rays, generated by an x-ray source, and converts them into light energy, which is then detected by the photodiodes 148. The photodiodes, due to their construction, perform as capacitors and store energy in the form of a charge.

Figure 2:
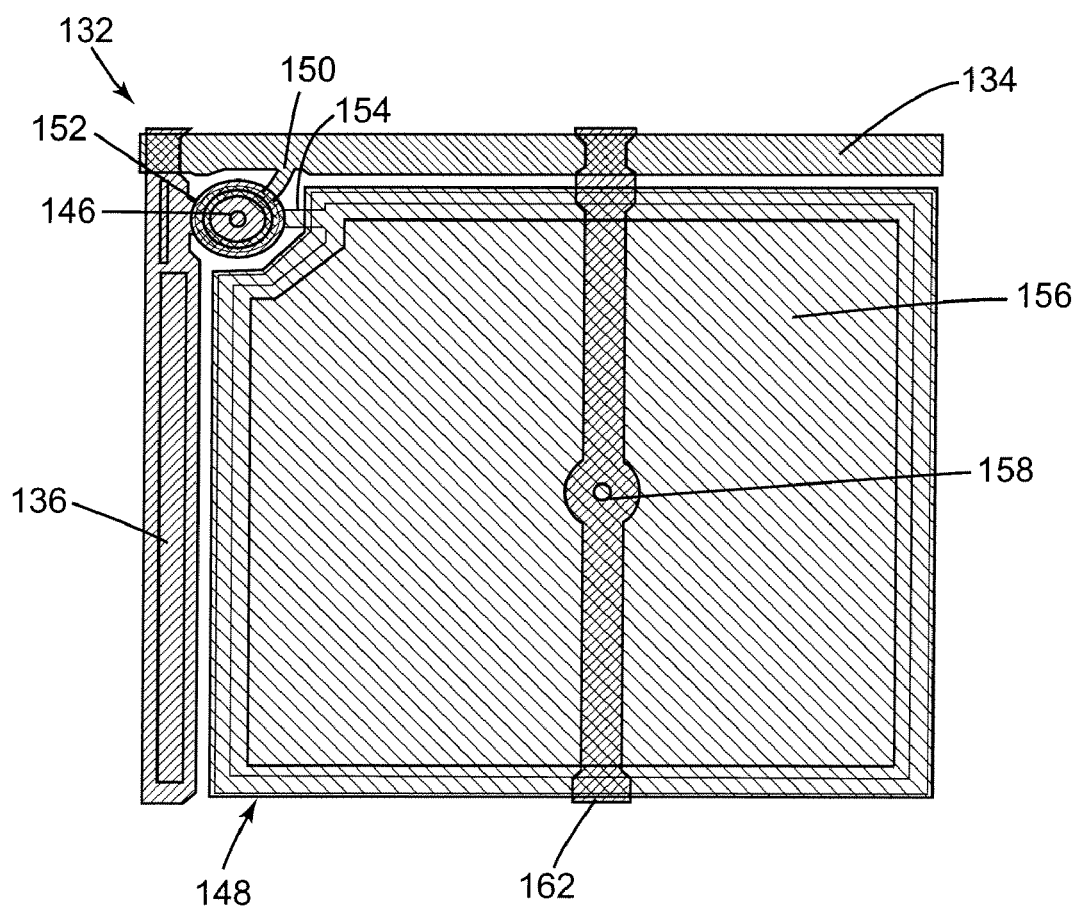
FIG. 2 is a plan view of a typical pixel structure in a flat panel digital detector.
Figure 3:
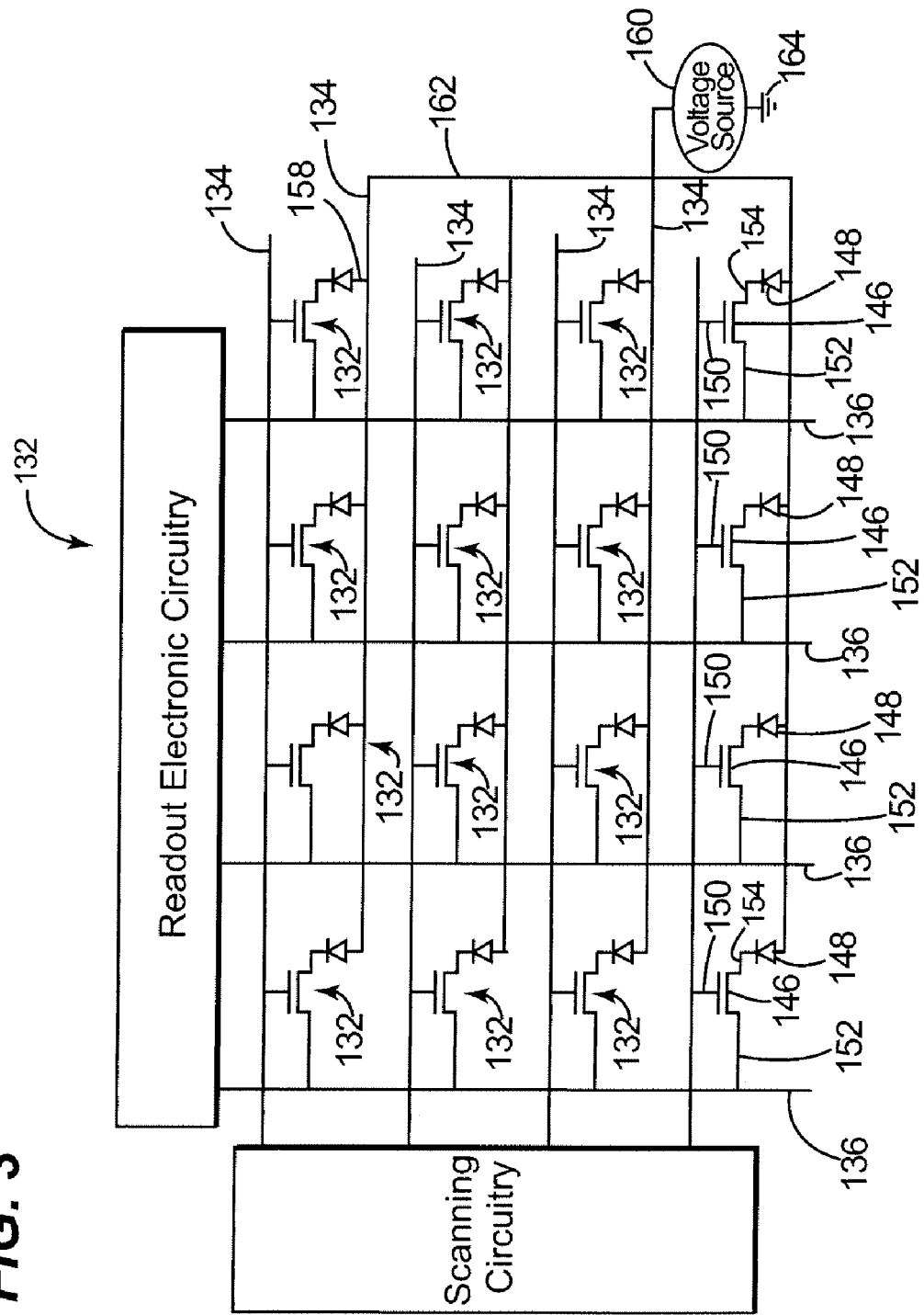
FIG. 3 is a prior art figure of a typical flat panel x-ray detector that includes an array of 2D photosensitive diodes and switching transistors (FETS) arranged in rows and columns.

Referring to FIG. 2, a plan view of a typical pixel structure 132 in a flat panel digital detector such as the detector 32 shown in FIG. 3 is shown. FIG. 2 illustrates a single pixel within a typical flat panel x-ray detector and includes one scan line 134 and one data line 136. Each FET 146 is associated with a photodiode 148 and includes a gate terminal 150, a drain terminal 152, and a source terminal 154.

The photodiode 148 has a cathode 156 and an anode 158. The cathode 156 is coupled to the source terminal 154 of the FET. As shown in more detail in FIG. 3, the anode 158 is coupled to a voltage source 160 at a common electrode 162 and has a common electrode voltage potential. The voltage source 160 is coupled to a common ground 164. Assuming that the FET 146 performs as an ideal switch, voltage potential across the photodiode 148 formed by the difference in potential between the data line potential, and the common voltage potential, may be referred to as the photodiode bias.

The scan and data lines may be continuous across the entire panel or may be cut once (typically in the middle) and are connected to external electronics at the edge(s) of the panel as disclosed in U.S. Patent Publication 2005/0121616 A1, the disclosure of which, including references cited therein, is herein incorporated by reference. Typically, a single pixel forms a unit cell that is repeated across the entire panel and thus all pixels are designed to be substantially identical.

As disclosed in U.S. Patent Publication 2005/0121616 A1, which is herein incorporated by reference, the detector may have a split design with a left half having pixels coupled to a first drive circuitry and a right half having pixels coupled to a second drive. Each pixel in the left half is coupled to a common data line with a pixel in the right half. Each of the halves and have corresponding sets of pixels, scan lines, and data lines, some examples of which are stated below. There may be any number of sets and the sets may be of various sizes. The scan lines are split such that the pixels in the left half are coupled to the scan drivers of the first drive circuitry and the pixels in the right half are coupled to the scan drivers of the second drive circuitry. Various sequential read-out techniques may be used to read each selected or selected groups of pixels.

FIG. 4 is plan view of a portion of a flat panel detector 33 such as the detector shown in FIG. 1 accordance with an embodiment of the invention.

In an embodiment of the invention shown in FIG. 4, additional scan lines or data lines are added to increase the unit cell to larger than a single pixel.

Although the adjacent scan lines, such as scan lines 40a, 40b are shown as being spaced apart from each other, the adjacent scan lines may be "stacked" on top of each other so as to maximize the photodiode fill factor. When the adjacent scan lines are stacked, the adjacent stacked scan lines are spaced apart or separated by an insulating material, in a direction orthogonal to the plane of the detector 33. The separation or insulating material assures that there is not a conductive connection between the adjacent scan lines, similar to the separation between the scan lines 40, shown in FIG. 1, that are not stacked.

During operation of the detector 33, the pixel unit cells 60 are scanned by scanning circuitry 38 (shown in FIG. 1), via scan lines 40, to generate exposure data.

Each cell 60 independently measures intensity of the x-ray radiation received over a corresponding pixel exposed area or photodiode area to generate the exposure data. The exposure data is received and digitized by readout electronics or circuitry 42 through use of the data lines 44 (shown in FIG. 1).

As shown in FIG. 4 a scan lines 40a, 40b operates to energize the FETs 62a, 62b, respectively, when powered or energized. Referring now to FIG. 4, block diagrammatic view of the pixel unit cell 60 is shown in accordance with an embodiment of the invention. The pixel unit cell 60 has two pixels 60a (shown in FIG. 4 on a left side of pixel unit cell 60), and 60b (shown in FIG. 4 to the right of pixel 60a) each including a respective photodetector portion such as a photodiode 64a, 64b (shown as a top and a bottom portion of photodiodes 64a, and photodiode 64b, respectively) associated with pixels 60a,60b and a nonphotodetector portion, wherein the pixels 60a, 60b of the pixel unit cell 60 are coupled to at least two lines selected from a scan line 40a or 40b that activates the non-photodetector portion such as the FETs 62a, 62b. The FET location defines the pixel unit cell dimensions, wherein the pixel unit cell is the smallest structure that is repeated within the detector array. As shown in FIG. 4, each FET within the unit cell 60 is attached to every other scan line. The FET 62a associated with a pixel 60a attaches to scan line 40a, and the FET 62b associated with pixel 60b is relocated within the pixel 60b (shown in the middle of pixel 60b in FIG. 5) to connect with scan line 40b. The two pixels 60a, 60b define a 2×1 pixel unit cell. An additional scan line 40b is added to attach to a selected number of FETs associated with a selected number of pixels, wherein the selected number of FETs are moved to a different location within the pixel to facilitate connection with the additional scan line.

The new scan line 40b that runs through a portion of the pixel unit cell 60 reduces the potential of shorts between the respective scan or data lines. In order to minimize the capacitance of the new scan or data line and the capacitive coupling to each photodiode, the photodiode material above the new scan line 40b is eliminated. Each split photodiode 64a, 64b includes an associated conductive bridge 82a, 82b, respectively or contact linking the cathodes 74a, 74b of each of the split photodiodes together. The conductive bridge 82a, 82b includes a conductive material such as a metal and connects two portions of each photodiode 64a, 64b across the additional scan line 40b. An additional via 65a, 65b, respectively connects a common electrode 76 to both portions of each the split photodiodes 64a, 64b, respectively.

Referring now to FIG. 5, a schematic and block diagrammatic view of an x-ray detector panel 33, formed of the pixel architecture shown in FIG. 4 having double scan lines 40b, wherein scan line 40b splits each pixel diode 64a, 64b in to two portions and data lines 44 each associated with selected pixel unit cells 60, in accordance with an embodiment of the present invention is shown. A selected portion of pixels 60a, 60b includes split photodiodes 64a, 64b, respectively in half by either an associated scan line 40b, wherein the two photodiodes 64a, 64b are each coupled in parallel with a common electrode 76 connected to a respective anode 84a, 84b of each photodiode 64a, 64b, respectively. The common electrode 76 is further connected to a voltage source 80.

As shown in FIG. 5, every other pixel 60 includes respective field effect transistors (FET) 62 associated with the split diodes 64a, 64b. Each FET 62 arranged in an alternating pattern includes a gate terminal 70, a drain terminal 72, and a source terminal 75. Thus, every other pixel 60 includes a FET 62 associated with the split diodes 64a, 64b.

In an embodiment of the invention shown in FIG. 5, twice the number of scan lines 40 are provided since each FET associated with each pixel portion 60a, 60b is coupled to an associated first scan line 40a and a second scan line 40b, respectively.

A first set of scan lines 40a are coupled between the gate terminals 70 of selected FETs and the drive or scanning circuitry 38 and operate to activate each of the 64a pixels when energized. A second set of scan lines 40b are coupled to a set of selected FETs not connected to the first set of scan lines 40a and activate each of the 64b pixels when energized. The data lines 44 are coupled between the drain terminals 72 of selected FETS and the readout electronics of the readout electronic circuitry 42.

The scan lines 40a, 40b are used to activate selected FETs within a row or a row segment and to simultaneously allow corresponding photodiodes within a particular row or row segment to charge. The data lines 44 are used to discharge the photodiodes 64, thereby collecting exposure or offset data therefrom. The data lines 44 are used by readout circuitry 42 to read the amount of charge discharged from the photodiodes 64. As each scan line 40a, 40b is activated, each data line 44 has an associated readout channel (not shown) from which the acquisition processing circuit 48 or readout circuitry 42 receives the exposure data, from the photodiodes 64a, 64b, within each pixel unit cell 60 on an associated activated scan line, are simultaneously restored to an initial charge.

Referring now to FIGS. 1 and 5, the voltage across the photodiodes 64 of each pixel unit cell is generally controlled by the bias circuitry 46. The photodiode common bias or electrode circuitry 46 is electrically coupled to the detector 32, 33 and controls the anode voltage of the pixel unit cells 60.

A controller 50 is electrically coupled to both the readout circuitry 42 and the scan circuitry 38. The controller 50 controls the order and speed of readout, as well as the photodiode common bias voltage. Although, the controller 50 is shown as being part of the readout circuitry 42 it may be part of other circuitry, such as the photodiode common bias circuitry 46, the scan circuitry 38, or the acquisition control and image processing circuit 48. The controller 50 is electrically connected to the common electrode 76. The controller 50 may change the common electrode potential in accordance with the desired application. The potential of the common electrode 76, which effects and is directly related to the photodiode bias, is controlled by the controller 50.

The bias voltage to which the split photodiodes 64a, 64b are charged is equal to the difference between the voltage level of the common electrode 76 and the voltage level of a respective photodiode data line. In order for the photodiodes 64a, 64b to store a capacitive charge, they are reverse biased, such that each photodiode anode 84a, 84b of each split photodiode 64 are coupled to the common electrode 76, which has a voltage potential that is more negative than that of the data lines 44.

An acquisition control and image processing circuit 48 is electrically coupled to the x-ray source 24, the scanning circuitry 38, the readout circuitry 42, and the bias circuitry 46 and coordinates operation thereof. The acquisition control and image processing circuit 48 reconstructs an image 34 in response to the exposure data, which is displayed on the monitor 36.

The acquisition control and image processing circuit 48 and the controller 50 may be microprocessor based, such as a computer having a central processing unit, memory (RAM and/or ROM), and associated input and output buses. The processing circuit 48 and the controller 50 may simply be formed of logic state machines or of other logic devices known in the art. The processing circuit 48 and the controller 50 may be a portion of a central main control unit, an electronic control module, or may each be stand-alone controllers, as shown.

A plurality of similarly formed pixel unit cells 60 may be arranged in alternating patterns to form a plurality of pixel unit cells that may be selectively enabled to activate the photodetector portion and to determine an EMI correction data offset value.

Referring now to FIGS. 1 and 5, the detector 33 is divided into multiple pixel unit cells 60 that include read pixels or sub-pixels, that are read out to readout electronics by an associated data line and calibration pixels that provide calibration data to determine EMI correction data (ECD). Depending on which scan line is energized, each pixel may be a read pixel or a calibration pixel. Each pixel unit cell 60 is a smallest geometry of one or more pixels associated with a repeating pattern of read pixels and calibration pixels, wherein the pitch of each pixel unit cell 60 is equal to a largest dimension of a group of repeating pixels in a linear x or y direction. The pitch of each EMI correction data pixel (ECD) is equal to the number of scan lines multiplied by a minimum predefined pitch of each pixel. In an embodiment of the invention, a distance between two adjacent scan lines is defined the pixel pitch.

A portion of selected detectors having varying pixels unit cells in accordance with several embodiments of the invention are shown in FIGS. 6-9, and 12-13, the detector 33 may have any number of pixels unit cells ranging in dimension of M by N defining a number of individual pixels per pixel unit cell, wherein M is a positive integer defining a number of individual pixels per row or row segment and N is a positive integer defining a number of individual pixels per column.

Each data line is connected via an associated FET and diode pixels to selected portions of pixels in the data line's associated column. Similarly, each scan line is connected via associated FETs to a portion of the pixels in an associated row. Since every pixel on the row must be connected to a scan line in order to function properly, the remaining pixels must be connected to one of the adjacent scan lines.

Both the even and the odd data lines have substantially equivalent structures and characteristics including, but not limited to resistance, capacitance, geometric shape and size, optical reflectivity, material, and wherein the number of FET's attached to the even and odd data lines and are closely spaced apart.

In an embodiment of the invention, a total number of n+1 scan lines for each set of rows having pixels forming a repeating pixel unit cell may added at every n number of rows defining respective pixel unit cells, wherein n is a positive integer. A plurality of pixel unit cells are arranged in a repeating pattern, wherein each unit cell is defined by n by m pixels, and wherein n defines a number of rows and m defines a number of columns associated with each unit cell. EMI correction data is obtained at every n+1 pixel as described in more detail below. Additionally, the pitch of the panel including EMI correction data is the minimal number of scan lines needed to activate the selected pixel unit cell multiplied by a minimal predefined pitch.

In an embodiment of the invention, a non-operational ("dummy") scan line is added through each row of pixels that does not have an operational additional scan line. Addition of the dummy scan lines allows each pixel in the detector array to have substantially similar characteristics and thus, to avoid spatially correlated image artifacts. Dummy scan lines assure that each pixel will have similar low level characteristics including, but not limited to overall capacitance, capacitive coupling coefficients, fill factor, light collection efficiency, and lag.

When running in a normal EMI correction mode, an increased number of scan line connections and electronics are needed and the panel read-out rate is reduced for each additional scan line added. However, the panel read-out rate may be reduced by selectively energizing individual or groups of scan lines and by selectively reading out individual or groups of pixels unit cells.

The readout time for a detector panel having a predefined minimum pixel pitch X, wherein the detector panel has n rows and n+1 scan lines associated with repeating patterns of pixels forming repeating pixel cells. The pixel pitch X of the detector panel is multiplied by a scalar factor equaling n+1/n to determine an actual panel readout time rate $((n+1/n)*X)$ when EMI correction occurs.

In an embodiment of the invention, the detector operates in an EMI detection mode when each scan line is separately energized, after a first scan line is energized, the image acquisition sequence continues when each subsequent scan line after the first scan line is sequentially and selectively energized and then each pixel or pixel unit cell is selectively and sequentially read by respective data lines.

When the detector is not operating in an EMI detection mode, but rather, a normal, non-EMI detection mode (normal operating mode), the operation of the detector may be the same as a detector that does not have additional scan lines through use of selective activation of one or more scan lines and data lines to energize and read the pixels or sets of pixel cell units in the detector. When operating in a normal mode, the number of scan lines simultaneously energized at one time during sequential reading of the detector is equal to n+1, wherein EMI correction occurs at every n+1 pixel, if n+1 pixels are read when n+1 scan lines are activated, the EMI correction pixels are activated and read out on the data lines as a read pixel and no EMI calibration data is provided. Thus, for EMI correction to occur, no more than n scan lines may be simultaneously energized at one time per panel read.

In an embodiment of the invention, whether the detector is operating in an EMI correction mode or a normal mode, a minimum number of data lines that are simultaneously in a sequential manner across a selected portion of pixels during each scanning event equals n+1. Thus, if EMI correction occurs at every n+1 pixels, during activation of each scan line per row or groups of row, n+1 groups of data lines read out data from each n+1 pixel cell unit.

In an embodiment of the invention shown in FIGS. 6-7 includes a portion of a detector capable of operating in either a normal mode or an EMI correction mode. The detector includes twice as many scan lines as shown in FIG. 2.

FIG. 6 is a schematic of a pixel architecture of a portion of a detector illustrating a double scan line configuration in accordance with an embodiment of the invention.

In an embodiment shown in FIG. 6, a portion of a detector display 300 is shown having a plurality of pixels 304 arranged in every other column, and a plurality of pixels 306 arranged in every other column adjacent to the 304 pixels. For example purposes, the pixel unit cells of the detector are arranged rectangularly in rows or row segments and columns, of course other arrangements may be used. Each row or row segment is designated by scan lines and each column is designated by data lines.

A plurality of FETS are associated with each of the pixels 304 and 306. Every other FET, illustrates as enlarged black rectangles, has been moved to a new scan line, thereby resulting in a 1×2 pixel unit cell 330 that is repeated over the entire panel. The two scan lines per row of pixels form a 1×2 pixel unit cell.

A plurality of pixels arranged in each row alternate between pixels 304 and 306, wherein pixels 304 are odd pixels and are located on the odd data lines (Data lines 1, 3, ... m, wherein m is an odd integer) and the odd scan lines, and the even pixels 306 are located on the even data lines (Data lines 2, 4, ... n, wherein n is an even integer) and the even scan lines. Pixels 304 are each formed from the following sets of pixel portions: 304a1 and 304a2; 304b1 and 304b2; 304c1 and 304c2; and 304d1 and 304d2 respectively. Similarly, pixels 306 are each formed from the following sets of pixel portions: 306a1 and 306a2; 306b1 and 306b2; 306c1 and 306c2; and 306d1 and 306d2 respectively.

As shown in FIG. 6, each of the pixels are further associated with a particular row segment and are activated by an associated scan line. For example pixel 304 formed by pixel portions 304a1 and 304a2 is located in row segment a1 and is activated by scan line a1.

Each row or row segment is either activated by an even scan line or an odd scan line. Each row having a second scan line splitting the photodiodes in the row is made of two row segments, shown in FIG. 6 as follows: Row A is defined by row segments a1 and a2, Row B is defined by row segments b1 and b2, Row C is defined by row segments c1 and c2, and Row D is defined by row segments d1 and d2. An unlimited number of rows z may be defined by segments z1 and z2, wherein z1 is associated with and activated by an odd scan line and z2 is associated with and activated by an even scan line.

When the odd pixels 304 are activated by an odd scan line, the odd pixels are the read pixels and even pixels are the calibration pixels. Similarly, when the even pixels 306 are activated, the even pixels are the read pixels and the odd pixels are the calibration pixels.

In an embodiment of the invention when the detector is operating in an EMI correction mode, each scan line is sequentially and consecutively energized. When operating in this mode, the detector operates at half the detector's normal operating speed, thus the panel read out rate decreases to half the rate associated with a normal panel read out and provides real-time EMI correction data at every other pixel location across the entire active area.

In an embodiment of the invention, the pitch of each EMI correction pixel unit cell 330 equals the number of scan lines necessary to activate a pixel unit having a repeating pattern, wherein in FIG. 6, the number of scan lines is two lines multiplied by a minimal predefined pitch. In an embodiment of the invention, the predefined pitch equals 200 um, thus the pitch of the EMI correction pixel unit cell equals 400 um.

When operating in the EMI correction mode, as described with reference to FIG. 6, the first scan line is energized, and the odd pixels 304, which are connected by FETs to the odd data lines (data lines 2, 4, 6 . . . a, wherein a is a positive even integer), are discharged and the image signal including EMI distortion is read-out on the odd data lines by the readout electronics. Since the even pixels 306 do not have FETs connected to the odd scan lines, the signal on the even data lines (data lines 1, 3, 5, . . . b, wherein b is a positive odd integer) is generated by EMI and an offset signal, wherein the EMI and offset signal has an offset related to charge leaking out of each of the associated FETs connected to a respective data line in addition to a signal generated by EMI charge substantially originating from other FETs connected to the same associated even data line.

Thus, signal from even data lines represents the EMI pickup only from the EMI data or the offset corrected data. The EMI signal transmitted along the even data lines is measured simultaneously with the image signal transmitted along the odd data lines. Each data line reads the pixels in sequential order individually or as sets of pixels (pixel unit cells), wherein individual or groups of data lines are simultaneously read out to the readout electronics. Once each pixel or pixel unit cell is read, the pixel is reinitialized to an initial state.

In an embodiment of the invention, an offset value is determined from EMI calibration data sensed along a data line when no x-rays illuminate the panel or portions of the panel, wherein when no x-rays are illuminated the FETs associated with pixels that are sensed are off. A standard offset correction is determined by subtracting the signal read from the data line when no x-rays illuminate from the signal read from the same data line when the x-ray image illuminates the panel at an earlier or at a later time than when the x-rays do not illuminate the panel. The offset correction represents the EMI only contribution to the signal on an associated data line. The offset corrected data from offset value along an associated data line may be used to correct the EMI from the image data read out along the associated data line. In one embodiment of the invention, the EMI data from two adjacent data lines is averaged to remove an EMI signal gradient.

In another embodiment of the invention, EMI data from more than two adjacent data lines is used to remove both the EMI signal gradient and to reduce the extra electronic noise associated with the EMI correction process. Statistical methods such as, but not limited to a least squares fit method or interpolation may be employed to obtain a low noise EMI correction data at a desired pixel or pixel unit cell.

In an embodiment of the invention, an alternative arrangements of FETs may be arranged such that the odd pixels and the even pixels are transposed. The panel having the alternative pixel architecture would operate in a similar manner to the panel shown in FIG. 6.

To increase uniformity in the EMI detection and prevention, alternative arrangements of the FETs, called binning, may be made achieve optimal EMI correction by providing for uniform spatial frequency of the EMI correction pixels. Additionally, when operating in a binning mode, the read-out speed along the data lines is increased.

In an embodiment of the invention, FETs are placed along n+1 number of scan lines (wherein n equals a total number of rows for a desired repeating pattern of FETs) such that so that the pixels within the detector are binned to include an EMI correction pixel at every n+1 pixels. When pixels are corrected at every n+1 pixel, special frequency of EMI correction pixels is optimal.

FIG. 7 is a schematic of a binned pixel architecture of a portion of a detector illustrating a double scan line configuration in accordance with an embodiment of the invention. More particularly, FIG. 7 is a block diagram of a portion of a detector 302, wherein the pixels 304, 306 are arranged in a checkerboard pattern such that pixels 304 and 306 alternate with every column and row. The checkerboard pattern provides optimal arrangement of the pixels to achieve optimal EMI correction by providing for uniform spatial frequency. The architecture of the pixels shown in FIG. 7 provides a symmetrical distribution of pixels, wherein the spatial resolution of the detector is cut in half in one dimension.

In another embodiment of the invention, in addition to the arrangement of the pixels, binning may be performed by selectively activating scan lines to allow for desired panel read out speeds when in both the EMI correction mode or in the normal operating mode.

As shown in FIG. 7, the odd scan lines are depicted as scan lines a1, b1, c1, . . . Ro, wherein Ro corresponds to a particular odd row number, and the even lines are depicted as scan lines a2, b2, c2, . . . Re wherein Re corresponds to a particular even row number.

In an embodiment of the invention when operating in an EMI correction mode, scan line a1 is energized and activates each of the 304 pixels (formed from pixel portions 304a1 and 304a2, respectively) in Row a1, which are read by associated data lines to the readout electronics. When row a2 is activated, each of the 306 pixels (formed from pixel portions 306a1 and 306a2, respectively) read out calibration data used to correct EMI offset in the 304 pixels formed from pixel portions 304a1 and 304a2, respectively to the data lines. Each subsequent scan line (scan line b1, scan line b2, . . . scan line Ro, scan line Re) is then activated sequentially and correction continues in a like manner, wherein the panel read out rate is decreased by half due to double the number of scan lines that are energized and the pixels that are then read by the data lines.

In another embodiment of the invention, when operating in a binned EMI correction mode, as shown in FIG. 7, either two odd or two even scan lines are simultaneously energized to bin signals in adjacent rows. As shown in FIG. 7, two sets of each pixels 304 (for example, 304a1 and 304a2; and 304b1 and 304b2) and 306 (for example, 306a1 and 306a2; and 306b1 and 306b2) form a 2 by 2 pixel unit cell 332 due to the arrangement of the FETs associated with each of the pixels in a two-dimensional 2 by 2 pixel, respectively pattern. In a binned EMI correction mode, EMI correction data is still obtained from every other column, as it is in the embodiment shown in FIG. 6, but the detector can read at an original panel read rate of 1× because only half of the pixels in each row are read by associated data lines.

In the binned EMI correction mode shown in FIG. 7, initially, two odd scan lines (scan lines a1, and b1) are energized simultaneously to energize and bin the signal from pixels 304 that are located adjacent and diagonally from each other, wherein energized scan line a1 activates pixels 304a, each formed from pixel portions 304a1 and 304a2, and wherein energized scan line b1 activates pixels 304b formed from pixel portion 304b1 and 304b2. When pixels 304a and 304b are activated, then data from the pixels is read out on associated data lines to the readout electronics and EMI correction data is read out on associated data lines from pixels 306a and 306b. Once the two odd scan lines are read, the next sequential two even scan lines (scan lines a2, and b2) are energized simultaneously to energize and bin the signal from pixels 306 that are located adjacent and diagonally from each other, wherein energized scan line a2 activates pixels 306a, each formed from pixel portions 306a1 and 306a2, and wherein energized scan line b2 activates pixels 306b formed from pixel portion 306b1 and 306b2. When pixels 306a and 306b are activated, then data from the pixels 306a and 306b is read out on associated data lines to the readout electronics and EMI correction data is read out on associated data lines from pixels 304a and 304b.

Each subsequent sets of odd and even scan lines (scan lines c1, scan line d1, scan line c2, scan line d2 . . . scan line Ro, scan line Ro+1, scan line Re, scan line Re+1,) are then activated sequentially and correction continues in a like manner, wherein the panel read out rate is 1× due the simultaneous reading of two sets of scan lines at a time.

In the binned normal operation mode for detector portion 302, shown in FIG. 7, four adjacent scan lines (scan lines a1, a2, b1, and b2) associated with the 4-pixel unit cell 332 are energized at once, thereby reading the panel at twice the original read-out speed, 2×, with half the resolution, and with no EMI correction data.

However, all the modes of operating and reading the panel available for the symmetrical double scan line arrangement shown in FIG. 7 are not available for pixel designs where additional scan lines are added more than every other row in combination with asymmetrical groupings of pixels across the panel.

FIG. 8 is a schematic of a binned pixel architecture of a portion of a detector with a 2×3 pixel unit cell illustrating an additional scan line added after every second row of pixels in accordance with an embodiment of the invention.

In the embodiment shown in FIG. 8, a portion of a detector display 312 is illustrated. For every n rows, n+1 scan lines are provided. The detector display portion 312 adds an additional scan line after every second row, wherein n number of rows equals 2, and wherein the number of scan lines equals n+1, or 3. Thus, for every two rows, (n equals 2) of repeating pixel patterns, 3 scan lines (2 plus 1) are needed to activate every two rows. A 2×3 pixel unit cell (2 rows by 3 columns) 334 and provides EMI correction data at every third pixel when operating in an EMI correction mode. The addition of the additional scan line every second row decreases the panel read-out rate to 3 scan lines per every 2 rows or 1.5× slower than the original panel read out rate. The pitch of pixel unit cell used in an EMI correction mode in FIG. 8 equals 3 scan lines multiplied by a minimal predefined pitch of an individual pixel. In an embodiment of the invention, the pitch of an individual pixel is 200 um, and thus, the pitch of the cell 334 is 3 scan lines times 200 um, or 600 um.

Referring now to FIG. 8, the detector display portion 312 includes pixels 314, 316, and 318 arranged in repeating patterns across two rows and three columns as shown in pixel unit cell 334. An additional scan line is added after every other row, thereby splitting every other row of the detector portion 312 into two row segments shown in FIG. 8. An unlimited number of rows may be defined by a repeating pattern of non-split rows, in combination with split rows in between each non-split row. A first and second scan line activates the non-split row, and the second and a third scan line activate the split rows.

As shown in FIG. 8, a first set of pixels 314 and 318 is arranged in a repeating pattern of two pixels 314 and one pixel 318 on selected rows, wherein pixels 314 are associated with a first respective scan line (scan lines a, and c, respectively), and pixels 318 are associated with a second respective scan line (scan lines b1 and d1, respectively) adjacent to the respective first scan line (scan lines a, and c, respectively), a second set of pixels 316 and 318 are arranged in a repeating pattern on selected rows associated with two scan lines, wherein pixels 318 are associated with the second scan line (scans line b1, and d1, respectively) adjacent to the first scan line (scan lines a, and c, respectively), and wherein pixels 316 are associated with a third scan line (scan lines b2 and d2, respectively) adjacent to the second scan line (scan lines b1, and d1, respectively). The third scan line (scan lines b2 and d2, respectively) splits the pixels 316 and 318 in half, and thus splits every other row into row segments.

A plurality of FETS are associated with each of the pixels 314, 316, and 318. Each FET, illustrated as enlarged rectangular dots within a particular pixel, respectively associated with each pixel 314, 316, and 318 are each associated with a particular scan line. As illustrated in FIG. 8, pixels 314 are associated with the first scan line (scan line a, and c, respectively), pixels 318 are associated with the second scan line (scan line b1, and d1, respectively), and pixels 316 are associated with the third scan line (scan line b2, and d2, respectively).

The repeating arrangement of the pixels 314, 316, and 318 forms the 2×3 pixel unit cell 334 that is repeated over the entire panel, wherein the rows a and c are not split by a scan line, but the rows b and d are split by a scan lines, thus forming row segments b1 and b2, and d1 and d1, respectively. Row segments b1 and b2 form row b, and row segments d1 and d2 form row d. Rows a and c are activated when scan lines a and c are energized. Rows b and d are selectively activated, respectively when both scan lines b1 and b2, and when both scan lines d1 and d2, respectively are selectively activated.

Row segments b1 and d1 are selectively activated, respectively when scan lines b1, and d1 are selectively activated, and row segments b2 and d2 are selectively activated when scan lines b2, and d2, respectively are selectively activated.

In an embodiment of the invention, the detector portion 312 operates in a binned normal, non-EMI correction mode (binned normal mode). When operating in the binned normal mode, two rows are activated simultaneously by three adjacent scan lines. As shown in FIG. 8, to simultaneously activate adjacent rows, a, b, and c, d, respectively, three scan lines a, b1, and b2, associated with rows a and b, and three scan lines c, d1, and d2, associated with rows c and d, respectively are simultaneously energized. The readout rate of the panel would be 1× of the original panel readout rate due to three rows being read with only a third of the data total being read from each of the three rows.

When the detector portion 312 operates in an EMI correction mode, each scan line is activated separately. Thus, scan lines a, b1, and b2 are activated separately, and are each simultaneously read out on each set of three data lines (1-3, 4-6, . . . dataodd-dataodd+2, dataeven-dataeven+2) that correspond to the pixels within each pixel unit cell 334. When selectively activating scan lines a, and c, each set of repeating pixels forming pixel cell 334 of the pixels in each row are read to three sets of data lines, the pixels 314a in row a are read to data lines 1 and 2, and pixels 318 are read to data line 53 to provide calibration data for pixels 314a when scan line a is energized, and pixels 314c in row c are read to data lines 1 and 2, and pixels 318c are read to data line 3 provide calibration data for pixels 314c when scan line c is energized, respectively. Similarly, when selectively activating scan lines b1, and d1, respectively, pixels 318 formed from pixel portions 318b1 and 318b2 associated with in row segment b1 are read to every third data line (data line 1, data line 4) and pixels 316 formed from pixel portions 316b1 and 316b2 associated with row segment b1 are read to every other two data lines (data line 2, data line 3, and data line 5, data line 6) to provide calibration data for pixels 318, and pixels 318 formed from pixel portions 318d1 and 318d2 associated with row segment d1 are read to every third data line (data line 1, data line 4) and pixels 316 (formed from pixel portions 316d1 and 316d2) are read to every other two data lines (data line 2, data line 3, and data line 5, data line 6) to provide calibration data for pixels 318 associated with row segment d1. When selectively activating scan lines b2, and d2, pixels 316 (formed from pixel portions 316b1 and 316b2) associated with row segment b2 are read to every other two data line (data lines 2-3, and data lines 5-6) and pixels 318 associated with row segment b2 are read to every third data lines (data line 1, and data line 4) to provide calibration data for pixels 316 associated with row segment b2, and pixels 316 (formed from pixel portions 316d1 and 316d2) associated with row segment d2 are read to every other two data lines (data lines 2-3, and data lines 5-6) and pixels 318 associated with row segment d2 are read to every third data lines (data line 1, and data line 4) to provide calibration data for pixels 316 associated with row segment d2.

However, all the modes of operating and reading the panel available for the double scan line arrangement shown in FIGS. 6-7 are not available for the 2×3 pixel unit cell design.

In an embodiment of the invention, shown in FIG. 8, a 2×3 pixel unit cell design is shown. The panel having the 2 by 3 pixel cell arrangement cannot be read at an original speed and resolution, wherein an original speed and resolution is the read out speed and resolution of the detector that occurs when no EMI correction data is present. Additionally the panel shown in FIG. 8 cannot be run in a binned mode with EMI correction data because of the asymmetric arrangement of the pixels and scan lines throughout the panel. However, a 2-row binned mode with no EMI correction having the pixel architecture shown in FIG. 8 may be performed using the panel arrangement shown in FIG. 8, thus allowing the detector to read at a normal 1× operating speed.

In an embodiment shown in FIG. 9, a portion of a detector display 320 is illustrated. FIG. 9 is a schematic of a pixel architecture of a portion of a detector with a 3×4 pixel unit cell illustrating an additional scan line added after every second row of pixels in accordance with an embodiment of the invention. For every n rows, n+1 scan lines are provided. The detector display portion 320 adds an additional scan line after third row, wherein n number of rows equals 3, and wherein the number of scan lines equals n+1, or 4. Thus, for every three rows, (n equals 3) of repeating pixel patterns, 4 scan lines (3 plus 1) are needed to activate every three rows. A 3×4 pixel unit cell (3 rows by 4 columns) 336 and provides EMI correction data at every third and fourth or every fourth pixel when operating in an EMI correction mode. The addition of the additional scan line every second row decreases the panel read-out rate to 4 scan lines/3 rows or 1.33× slower than the original panel read out rate. The pitch of pixel unit cell used in an EMI correction mode in FIG. 9 equals 4 scan lines multiplied by a minimal predefined pitch of an individual pixel. In an embodiment of the invention, the pitch of an individual pixel is 200 um, and thus, the pitch of the cell 336 is 4 scan lines times 200 um, or 800 um.

Referring now to FIG. 9, the detector display portion 320 includes pixels 322, 324, 326, and 328 binned in repeating patterns across three rows and four columns as shown in pixel unit cell 336. An additional scan line is added after every other two rows, thereby splitting every other two rows of the detector portion 320 into two row segments shown in FIG. 9. An unlimited number of rows may be defined by a repeating pattern of non-split rows, in combination with split rows in between every two non-split rows. A first, and a second scan line activates the first non split row, a second, and third scan line activates the second nonsolid row, the third and a fourth scan line activates the split rows.

As shown in FIG. 9, a first set of pixels 322 and 326 is arranged in a repeating pattern of three pixels 322 and one pixel 326 on selected rows, wherein pixels 322 are associated with a first respective scan line (scan lines a, and d, respectively), and pixels 326 are associated with a second respective scan line (scan lines b and e, respectively) adjacent to the respective first scan line (scan lines a, and d, respectively), a second set of scan pixels 326 and 328 is arranged in a repeating pattern of two pixels 326 and two pixels 328 on selected rows, wherein pixels 326 are associated with a second respective scan line (scan lines b, and e, respectively), and pixels 328 are associated with a second respective scan line (scan lines c1 and f1, respectively) adjacent to the respective second scan line (scan lines b, and e, respectively), a third set of pixels 324 and 328 are arranged in a repeating pattern of one pixel 328c, and three pixels 328 on selected rows associated with two scan lines, wherein pixels 328 are associated with the third scan line (scans line c1, and f1, respectively) adjacent to the second scan line (scan lines b, and e, respectively), and wherein pixels 324 are associated with a fourth scan line (scan lines c2 and f2, respectively) adjacent to the third scan line (scan lines c1, and f1, respectively). The fourth scan line (scan lines c2 and f2, respectively) splits the pixels 324 and 328 in half, and thus splits every other row into row segments.

A plurality of FETS are associated with each of the pixels 322, 324, 326, and 328. Each FET, illustrated as enlarged rectangular dots within a particular pixel, respectively associated with each pixel 322, 324, 326, and 328 are each associated with a particular scan line. As illustrated in FIG. 9, pixels 322 are associated with the first scan line (scan line a, and d, respectively), pixels 326 are associated with the second scan line (scan line b, and e, respectively), 328 are associated with the third scan line (scan line c1, and f1, respectively), and pixels 324 are associated with the fourth scan line (scan line c2, and f2, respectively).

The repeating arrangement of the binned pixels 322, 324, 326, and 328 forms the 3×4 pixel unit cell 336 that is repeated over the entire panel, wherein the rows a, b and d, e are not split by a scan line, but the rows c and f are split by a scan lines, thus forming row segments c1 and c2, and c1 and c1, respectively. Row segments c1 and c2 form row c, and row segments f1 and f2 form row f. Rows a, b and d, e are activated when scan lines a, b and d, e are energized. Rows c and f are selectively activated, respectively when both scan lines c1 and c2, and when both scan lines f1 and f2, respectively are selectively activated.

Row segments c1 and f1 are selectively activated, respectively when scan lines c1, and f1 are selectively activated, and row segments c2 and c2 are selectively activated when scan lines c2, and f2, respectively are selectively activated.

In an embodiment of the invention, the detector portion 320 operates in a binned normal, non-EMI correction mode (binned normal mode). When operating in the binned normal mode, three rows are activated simultaneously by four adjacent scan lines. As shown in FIG. 9, to simultaneously activate adjacent rows, a, b, and c, and d, e, and f respectively, four scan lines a, b, c1, and c2, associated with rows a, and b, and c, four scan lines d, e, f1, and f2, associated with rows d, e, and f, respectively are simultaneously energized. The readout rate of the panel would be 1× of the original panel readout rate due to four rows being read with only a portion of the data total being read from each of the four rows.

When the detector portion 320 operates in an EMI correction mode, each scan line is activated separately. Thus, scan lines a, b, c1, and c2 are activated separately, and are each simultaneously read out on each set of four data lines (1-4, 5-7, . . . dataodd-dataodd+3, dataeven-dataeven+3) that correspond to the pixels within each pixel unit cell 336. When selectively activating scan lines a, b, and d, e each set of repeating pixels forming pixel cell 336 in each row are read to four sets of data lines, the pixels 322a in row a are read to data lines 1-3, and pixels 326a are read to data line 4 to provide calibration data for pixels 322a, and the pixels 322d in row d are read to data lines 1-3, and pixels 326d are read to data line 4 to provide calibration data for pixels 322d, respectively. The pixels 326b in row b are read to data lines 1-2, and pixels 328b are read to data line 3-4 to provide calibration data for pixels 326b, and the pixels 326e in row e are read to data lines 1-2, and pixels 328e are read to data line 3-4 to provide calibration data for pixels 326e, respectively. Similarly, when selectively activating scan lines c1, and f1, respectively, pixels 328 (formed from pixel portions 328c1 and 328c2) associated with row segment c1 are read to every fourth data line (data line 1, data line 5) and pixels 324 (formed from pixel portions 324c1 and 324c2) are read to every other three data lines (data lines 2-4, and data lines 5-7) to provide calibration data for pixels 328 associated with row segment c1, and pixels 328 formed from pixel portions 328f1 and 328f2 associated with row segment e1 are read to every fourth data line (data line 1, data line 5) and pixels 324 associated with row segment f1 are read to every other three data lines (data lines 2-4, and data line 5-7) to provide calibration data for pixels 328 associated with row segment f1. When selectively activating scan lines c2, and f2, pixels 324 (formed from pixel portions 324e1 and 324e2) associated with row segment c2 are read to every other three data lines (data lines 2-4, and data line 6-8) and pixels 328 associated with row segment c2 are read to every fourth data lines (data line 1, data line 5) to provide calibration data for pixels 324 associated with row segment c2, and pixels 324f2 in row segment f2 are read to every other three data lines (data lines 2-4, and data line 6-8) and pixels 328 in row segment f2 are read to every fourth data lines (data line 1, data line 5) to provide calibration data for pixels 324 associated with row segment f2.

However, all the modes of operating and reading the panel available for the double scan line arrangement shown in FIGS. 6-7 are not available for the 3×4 pixel unit cell design.

In an embodiment of the invention, shown in FIG. 9, a 3×4 pixel unit cell design is shown. The panel having the 3 by 4 pixel cell arrangement cannot be read at an original speed and resolution, wherein an original speed and resolution is the read out speed and resolution of the detector that occurs when no EMI correction data is present. Additionally the panel shown in FIG. 9 cannot be run in a binned mode with EMI correction data because of the asymmetric arrangement of the pixels and scan lines throughout the panel. However, a 3-row binned mode with no EMI correction having the pixel architecture shown in FIG. 9 may be performed using the panel arrangement shown in FIG. 9, thus allowing the detector to read at a normal 1× operating speed.

In FIG. 9, an additional scan line is only added at after every third row, wherein n equals 3, and wherein the number of scan lines equals n+1, or 4. This results in a 3×4 pixel unit cell and provides EMI correction data at every fourth pixel. The scalar factor that increases the total time to read-out the panel is 4/3 or 1.33×.

FIGS. 10-13 disclose embodiments of the invention that add additional data lines instead of additional scan lines, wherein the FETs associated with each unit cell 450 is attached to every other data line, wherein only one of the two data lines is operably coupled to each pixel.

As shown in an embodiment of the invention FIG. 10, the additional data lines separate each pixel photodiode into two portions, and the FETs are attached to the data lines in alternating arrangements similar to the architecture shown in FIGS. 6-7, wherein the data lines and the scan lines are transposed and wherein the pixel unit cell is defined by the location of the FETs within each pixel and repeating patterns of the pixels.

FIG. 10 illustrates an embodiment of the invention showing selected pixels 402 of a detector portion 400. FIG. 10 is plan view of a portion of a flat panel detector 340 with detector portion 400 having dual data lines 404a, 404b shown in accordance with an embodiment of the invention.

The FET 408a associated with a pixel 402a is coupled to and read out on scan line 404a, and the FET 408b associated with pixel 402b is relocated within the pixel 402b (shown in the middle of pixel 402b in FIG. 10) to couple with and to read out on data line 404b.

The detector portion 400 adds extra data lines 404b instead of extra scan lines 40b as shown in FIG. 4. As with the extra scan lines 40b in shown in FIG. 4, the extra data 404b lines run through the middle of each pixel 402a, 402b in order to minimize shorts between the data lines 404a, 404b and common electrode 406. The photodiode material is removed under the new data lines 404b in order to minimize capacitance, capacitive coupling, and noise. A conductive bridge 482 electrically couples diodes 412. Scan lines 420 are used to activate the FETs 408a, and 408b.

Thus, each data line 404 is connected via a FET 408 to a selected portion of the pixels in each associated column 410. Since each pixel within the detector must be connected to a data line 404 in order to properly read out to the readout electronics, the remaining pixels must be connected to an adjacent data line.

The new data line 404b that runs through a portion of the pixel unit cell 450 reduces the potential of shorts between the respective scan or data lines. In order to minimize the capacitance of the new scan or data line and the capacitive coupling to each photodiode, the photodiode material above the new data line 404b is eliminated. Each split photodiode 412a, 412b includes an associated conductive bridge 482a, 482b, respectively or contact linking the cathodes 474a, 474b of each of the split photodiodes together. The conductive bridge 482a, 482b includes a conductive material such as a metal and connects two portions of each photodiode 412a, 412b across the additional data line 404b. An additional via 465a, 465b, respectively connects a common electrode 406 to both portions of each the split photodiodes 412a, 412b, respectively.

FIG. 11 is a block diagram and schematic of a pixel architecture in a detector device having two data lines associated with each column of pixels in accordance with an embodiment of the invention. More particularly, FIG. 11 is a schematic of a portion 400 of the electric circuit forming the detector 340 having the pixels 402a, and 402b-defining the pixel unit cell 450 arranged in alternating patterns of FETs 408a and 408b, respectively associated with diodes 412a, 412b throughout the detector 340 in accordance with an embodiment of the invention. The FETS 408 are activated by associated scan lines 420 and are read out to each data line. The schematic of the additional data line pixel architecture is the similar to the architecture shown in FIG. 5.

FIG. 12 is a schematic of a pixel architecture of a portion of a detector 340 with a 1×2 pixel unit cell illustrating a double data line configuration associated with every column of pixels in accordance with an embodiment of the invention. In an embodiment of the invention shown in FIGS. 12-13, every other FET 408 is connected to a new data line 404a thereby resulting in a 1×2 pixel unit cell pattern 342 formed of pixels 344 and 346, wherein pixels 344 are formed from two pixel portion and wherein pixels 346 are formed from two pixel portions that are repeated across the entire detector panel. Similar to the design of the rows of pixels associated when additional scan lines are added, the diodes 412 within each column of pixels are split by the data lines, wherein two data lines are associated with each pixel in each column, and wherein the each of the columns a-d, are formed from column segments as follows: column segments a1 and a2 form column a, column segments b1 and b2 form column b, column segments c1 and c2 form column c, and column segments d1 and d2 form column d. Scan lines 1-4 sequentially activate each of the rows in detector 340.

FIG. 13 is a schematic of a binned pixel architecture of a portion of a detector 348 with a 1×4 pixel unit cell 350 illustrating a double data line configuration associated with every column of pixels in accordance with an embodiment of the invention. A block diagram schematic of a detector portion 348 shown in FIG. 13 in an embodiment of the invention. In an embodiment of the invention shown in FIG. 13, FETs associated with pixels 344 and 346 are arranged in alternating patterns in pixel unit cells 350 throughout the detector portion 348, wherein each FET is connected to either a first or a second data line in each column. The 1×4 pixel unit cell 350 allow 2-pixel binning to increase the read-out rate of the panel, in a similar manner to the detectors disclosed in FIGS. 6-7.

In addition to EMI correction, all designs described also have additional applications for correction of image artifacts. Correction data is also available on adjacent pixels on a given column as well as on a given row. While this information is not generally useful for EMI correction (since it occurs at earlier and later times) it can be used to perform corrections for other phenomena that vary more slowly over time. Examples of these phenomena include: leakage signal generated by all the other "off" FETs on the same data line, capacitive coupling artifacts associated with reading a flat panel x-ray detector while it is being exposed by x-rays, current induced during vibration or bending artifacts, and triboelectric currents generated in nearby conductors or insulators when the digital detector is mechanically stressed.

The above-described steps are meant to be an illustrative example; the operation of the detector may be performed synchronously, sequentially, simultaneously, or in a different order depending upon the application.

The present invention provides multiple x-ray detectors that may be applied in various applications. The x-ray detectors have varying pixel architectures including varying degrees, levels, and quantities of resolution, pixel unit cells, pixel connection pitch, scan driver channels, readout circuitry channels, noise performance, data line capacitance and resistance, power consumption, and heat generation. The detectors of the embodiments of the present invention provide a dual function x-ray detector capable of operating in a normal operation mode or in an EMI correction mode in accordance with multiple embodiments of the present invention.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A detector device comprising:
   at least one pixel having a photodetector portion and a non-photodetector portion;
   a first line for operably coupling to each of the portions of the pixel;
   a second line arranged to separate a portion of the at least one pixel, wherein the second line is not operably coupled to the at least one pixel; and
   wherein the first line is selectively enabled to selectively activate the photodetector portion.

2. The detector device of claim 1, wherein the photodetector portion comprises:
   two photodiodes coupled in parallel and separated by the second line;

wherein the non photodetector portion activates the two photodiodes to store a charge in response to a signal received by the first line.

3. The detector device of claim 1, further comprising:
at least two pixels forming a pixel unit cell, the at least two pixels each having a photodetector portion and a non-photodetector portion, wherein the first line selectively activates the photo detector portion of a first pixel of the at least two pixels and the second line selectively activates the photodetector portion of a second pixel of the at least two pixels;
wherein at least one of the two pixels communicates a signal representing charge stored within the photodetector portion to an associated data line after selective activation of the first line, and wherein at least one of the two pixels communicates electromagnetic interference (EMI) correction data to an associated data line to correct EMI in the other of the at least two pixels after selective activation of the second line.

4. The detector of claim 3, further comprising:
a plurality of pixels each having a nonphotodetector portion defined by a FET and photodetector portion defined by a photodiode;
a plurality of scan line coupled to a selected number of FETs associated with selective portions of the plurality of pixels, wherein portions of the scan line couple to gates of a selected number of FETs to activate the FET; and
a plurality of data lines coupled to a selected number of FETs in series with the photodetector portions to read-out a charge stored within selected photodetector portions to associated read-out electronics.

5. The detector device of claim 1, further comprising:
a plurality of first and second lines.

6. The detector of claim 5, further comprising:
two scan lines in signal communication with at least two data lines.

7. The detector device of claim 1, further comprising:
a third line operably coupled to each of the photodetector and non photodetector portions to read a signal representing charge stored in the photo detector portion in response to activation of the photo detector portion of the first line.

8. The detector of claim 1, further comprising:
a FET defining the non photodetector portion.

9. The detector of claim 1, wherein the second line is electrically insulated from the at least one pixel.

10. An x-ray detector device comprising:
a plurality of pixels including a photodiode portion and a FET portion for receiving x-ray signals;
at least one scan line coupled to at least a first portion of the pixels for selectively activating at least a first portion of the pixels;
at least one data line for conducting charge indicative of the x-ray signals;
a second scan line operably coupled to at least a second portion of the pixels for selectively activating at least a first portion of the pixels, wherein the second scan line is not operably coupled to the at least second portion of the pixels; and,
a second data line for conducting charge indicative of the x-ray signals from at least the second portion of the pixels.

11. The x-ray detector device of claim 10, further comprising:
a plurality of pixel unit cells arranged in a repeating pattern, wherein each unit cell is defined by n by m pixels, and wherein n defines a number of rows and m defines a number of columns associated with each unit cell.

12. The x-ray detector device of claim 10, further comprising:
a plurality of scan lines each associated with a portion of pixels in respective rows of pixels, wherein a total number of n rows exists for each repeating pattern of portions of the plurality of pixels defining a pixel unit cell; and,
a plurality of data lines in operable communication with the plurality of scan lines.

13. The x-ray detector of claim 12, wherein a total number of scan lines equals n+1.

14. The x-ray detector device of claim 12, further comprising:
a selected portion of the pixels defining calibration pixels, wherein every n+1 pixel along a respective row direction forms a respective calibration pixel that communicates calibration data to at least a portion of the plurality data lines.

15. The x-ray detector device of claim 12, further comprising:
a predefined pitch of the pixel unit cell defined as a number of scan lines necessary to activate the pixel unit cell multiplied by a minimal predefined pitch.

16. The x-ray detector device of claim 12, wherein the plurality of pixels are arranged in respective rows and columns within each pixel unit cell wherein selective rows of said plurality of pixels are coupled to double scan lines when n equals 1 and wherein a total number of scan lines associated with each pixel unit cell is equal to n+1.

17. A method for operating an x-ray detector comprising:
simultaneously acquiring image and electromagnetic inference (EMI) correction data during an acquisition; and
operating the detector in either a normal operating mode or in an EMI correction mode.

18. The method of claim 17, further comprising:
disabling collecting EMI correction data during the acquisition.

19. The method of claim 17, further comprising:
using the EMI correction data to suppress EMI from the detector.

20. The method of claim 17, further comprising:
binning a plurality of pixels within the detector in a symmetrical distribution of pixels within each pixel unit cell to achieve optimal EMI correction when operating in an EMI correction mode.

* * * * *

UNITED STATES PATENT AND TRADEMARK OFFICE
CERTIFICATE OF CORRECTION

PATENT NO. : 7,495,228 B1
APPLICATION NO. : 11/971533
DATED : February 24, 2009
INVENTOR(S) : Albagli et al.

It is certified that error appears in the above-identified patent and that said Letters Patent is hereby corrected as shown below:

On the Face Page, in Field (73), under "ASSIGNEE", in Column 1, Line 1, delete "Nishayuna," and insert -- Niskayuna, --, therefor.

Signed and Sealed this

Twenty-first Day of July, 2009

JOHN DOLL
*Acting Director of the United States Patent and Trademark Office*